United States Patent [19]
Esser et al.

[11] Patent Number: 5,892,643
[45] Date of Patent: Apr. 6, 1999

[54] GATE VOLTAGE MODULATION FOR TRANSISTOR FAULT CONDITIONS

[75] Inventors: Albert Andreas Maria Esser, Niskayuna, N.Y.; Lee Burton Silverthorn, Roanoke; Lyle Thomas Keister, Daleville, both of Va.

[73] Assignee: General Electric Company, Schenectady, N.Y.

[21] Appl. No.: 888,825

[22] Filed: Jul. 7, 1997

Related U.S. Application Data

[62] Division of Ser. No. 566,494, Dec. 4, 1995, Pat. No. 5,689,394.

[51] Int. Cl.⁶ .................................................. H02H 7/00
[52] U.S. Cl. ........................................ 361/18; 363/56
[58] Field of Search ................................ 363/5, 56, 95, 363/97, 98; 327/387, 401, 403–405, 415–417; 361/18, 56, 57, 86, 87

[56] References Cited

U.S. PATENT DOCUMENTS

| | | | |
|---|---|---|---|
| Re. 34,107 | 10/1992 | Wirth | 361/18 |
| 4,745,513 | 5/1988 | McMurray | 361/56 |
| 5,444,591 | 8/1995 | Chokhawala et al. | 361/18 |
| 5,485,341 | 1/1996 | OkadO et al. | 361/98 |

*Primary Examiner*—Matthew Nguyen
*Attorney, Agent, or Firm*—Ann M. Agosti; Marvin Snyder

[57] ABSTRACT

A power device control system includes a power device having an input gate and first and second output terminals, a controller, and a gate driver for supplying current to the input gate of the power device, comparing a voltage difference between the first and second output terminals, and providing a comparator signal to the controller if the voltage difference is greater than or equal to a predetermined maximum voltage difference. The controller is capable of providing a command signal to the gate driver and pulse width modulating the command signal upon receiving a comparator signal from the gate driver to gradually switch off the power device. The control system can further include a current sensor coupled between one of the first and second output terminals and the controller for supplying a current signal and an integrated current signal to the controller. The control system can be capable of variably pulse width modulating the command signal, and, in one embodiment, the modulation process includes varying on/off switching of the command signal to increase a percentage of off time during subsequent periods of modulation.

3 Claims, 5 Drawing Sheets

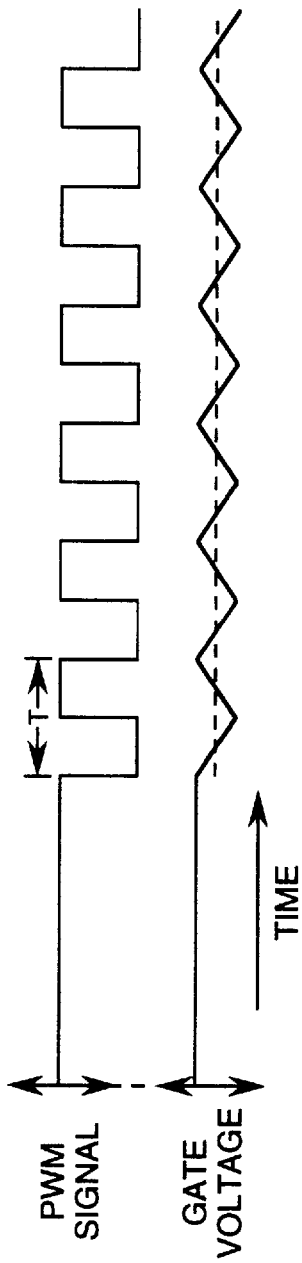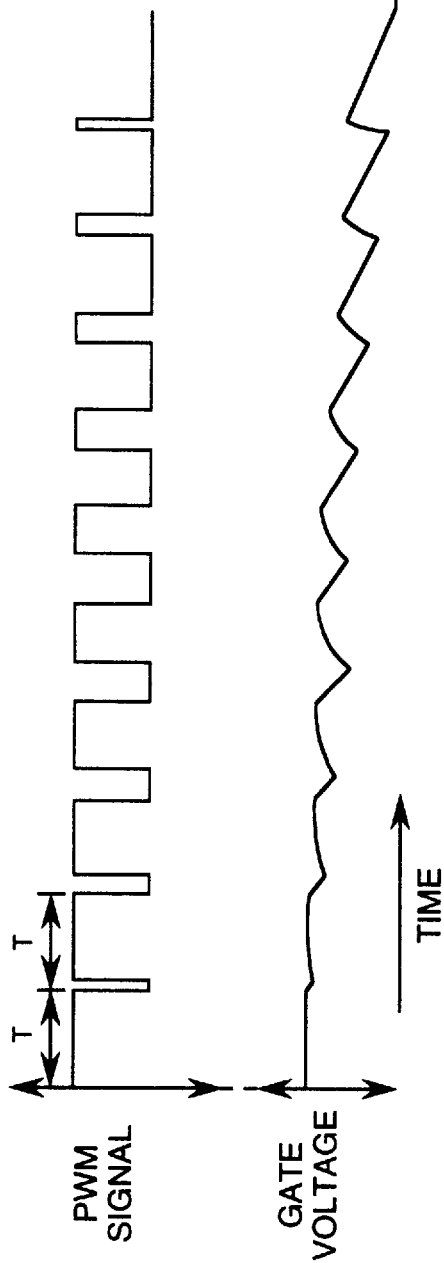

5,892,643

GATE VOLTAGE MODULATION FOR TRANSISTOR FAULT CONDITIONS

This application is a division, of application Ser. No. 08/566,494, filed Dec. 04, 1995, now U.S. Pat. No. 5,689,394, issued Nov. 18, 1997.

BACKGROUND OF THE INVENTION

In capacitive input power devices such as IGBTs (insulated gate bipolar transistors) and MOSFETs (metal oxide semiconductor field effect transistors), when excessive output currents occur during unexpected short circuit conditions, the time to turn off the device must occur over a long enough time interval to minimize any overvoltage which might be caused. This lengthening of the turn off time is necessary because overvoltage is the product of the inductance of the DC (direct current) bus and the di/dt. Therefore if the di/dt is large, the overvoltage will be correspondingly large.

Conventional techniques for responding to excessive device currents include applying a reduced gate voltage with a gate driver stage acting in an analog mode. A limitation of these techniques is that additional circuitry is required for the gate driver, and commercially available gate driver stages experience parasitic effects which prevent proper operation, especially when large power devices (such as, for example, 1000 A/1400 V IGBTs) are used.

SUMMARY OF THE INVENTION

It would be desirable to have a process for responding to excessive currents during short circuit conditions which does not require gate driver stage circuitry.

In the present invention, a controller can be used outside the gate driver for determining an appropriate response to a given short circuit condition. In the preferred embodiment, gate voltage to the device is adjusted by a pulse width modulation having a carrier frequency about 50 or more times higher than the switching frequency of a corresponding motor inverter. Using the controller of the present invention the gate driver can continue to operate digitally and can be controlled without the disadvantages of conventional gate driver stage analog circuitry approaches.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIG. 2 is a graph of a modulated signal and a corresponding gate voltage over time for a modulation embodiment of the present invention.

FIG. 3 is a graph of a modulated signal and a corresponding gate voltage over time for another modulation embodiment of the present invention.

FIG. 4 is a graph of a modulated signal embodiment which can be used in addition to the embodiment of FIG. 3.

DETAILED DESCRIPTION OF A PREFERRED EMBODIMENT OF THE INVENTION

Figure 1:
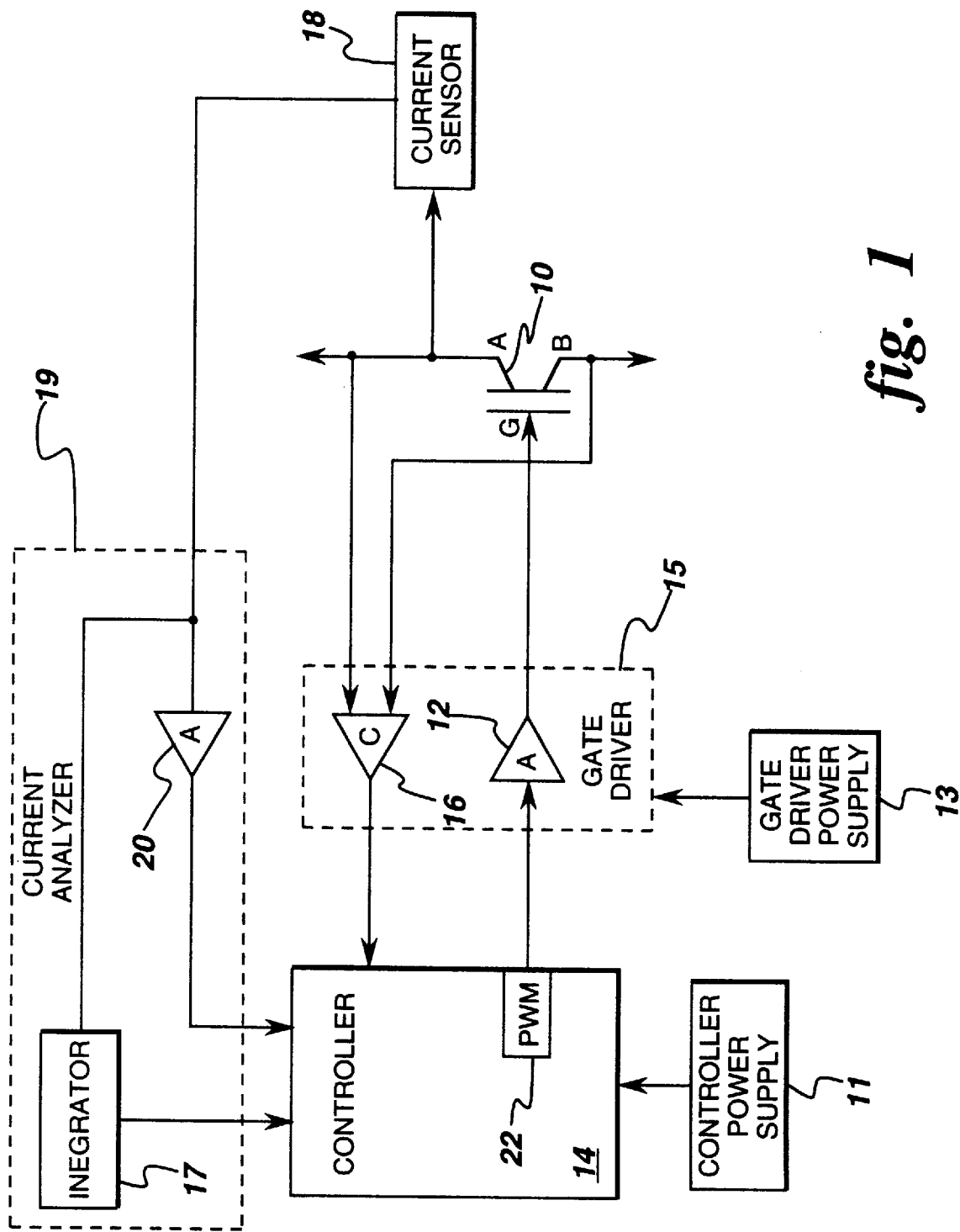
FIG. 1 is a circuit diagram of an embodiment of the present invention.

FIG. 1 is a circuit diagram of an embodiment of the present invention including a power device 10 having capacitive gate driven input such as a MOSFET, an IGBT, an MCT (MOS controlled thyrister), or an MTO (MOS turn-off thyristor), for example.

A gate driver 15 is used to drive the gate G of power device 10 and to monitor the voltage across power device output terminals A and B. A command signal from a controller 14 which receives its power from a controller power supply 11 is supplied to the gate driver and can be coupled in the gate driver by means (not shown) such as an optical coupler to a gate driver power supply 13 for directing when to transmit power through the gate driver to the gate. The gate driver can include an amplifier 12 for amplifying the coupled power command signal. The gate driver can include a comparator 16 for obtaining the voltage across terminals A and B ($V_{AB}$) of power device 10.

Comparator 16 preferably will only be activated (e.g., will only send a signal to controller 14) during those occurrences when $V_{AB}$ has reached a threshold voltage value indicative of power device saturation. In one embodiment wherein a +15 v/-15 v voltage supply is used, the threshold voltage value can be seven volts. When the comparator is activated and sends a comparator signal to controller 12, such signal is indicative of short circuit conditions across power device 10. Power device 10 is considered to be under fault conditions when the controller transmits a command signal for supplying power to the device and receives a comparator signal after a short time interval which screens out nonlinear effects during switching on of the device and is typically about 5 microseconds.

In one embodiment, controller 14 comprises a logic device such as a logic gate array which is capable of sending on/off switching signals, and a command signal is sent during the "on" intervals. Alternative embodiments of controller 14 include discrete logic device networks and/or analog networks.

In the event that $V_{AB}$ approaches a saturation level during a command signal interval, controller 14 includes a pulse width modulator 22 which can modulate the command signal sent to gate driver 15. $V_{AB}$ can be controlled by selecting the appropriate pulse width modulation for the on/off switching of the voltage to gate driver 15. Appropriate modulation for a particular embodiment will depend upon both the internal capacitance of power device 10 and the resistance of gate driver 15 (which form a low pass filter).

FIG. 2 is a graph of a modulated signal and a corresponding expected gate voltage over time for a modulation embodiment of the present invention. In one example, each of the on and off intervals occurs for 200 ns with each period T thus having a duration of 400 ns.

The gate voltage portion of the graph is an idealized waveform which does, not take into account the Miller effect of voltage discharge in the gate capacitor which will distort the waveform and cause the peak voltages to incrementally decrease. In the idealized graph, the mean voltage is 0 volts with the high and low voltages being about +15 volts and −15 volts, respectively. The magnitudes of the high and low voltages are dependent on the gate driver supply voltage.

The threshold voltage (5–7 volts) of the device is approached more slowly with the pulse width modulation and typically occurs after about 5 to 10 periods. Therefore the switching speed (di/dt) is decreased.

FIG. 3 is a graph of a modulated signal and a corresponding gate voltage over time for a preferred modulation embodiment of the present invention. By varying the on/off cycle to increase the length of off time during subsequent periods T, parasitic effects can be reduced and thus dependency on voltage discharge level characteristics of the gate of the power device is lessened because a spectrum of voltage discharge levels are represented. The average value of the gate voltage slopes slowly down, and the absolute threshold of the device is thus not important.

In the example of FIG. 3, during an initial period T one hundred percent of the period is in an on state, during the next period the first ten percent of the period is in an off state, during successive periods the duration of the off state is increased by ten percent of a period until a constant off state is reached. In one embodiment, each period has a duration of 400 ns.

FIG. 4 is a graph of a modulated signal embodiment which can be used in addition to the embodiment of FIG. 3. In the embodiment of FIG. 4, prior to an initial period T1 wherein one hundred percent of the period is in an on state, an off state of a fraction of a period occurs as represented by Tq. The off state has a duration sufficient to cause the gate voltage to almost reach its threshold level. For example, if the threshold level is 5–7 volts, the off state of Tq can be used to bring the gate voltage to 8 volts quickly, and the embodiment of FIG. 3 can then be used to more slowly approach the 5–7 volt threshold. The duration of the off state preferably ranges from 200 ns to 400 ns.

In one embodiment two periods, Tp and Tq, having off states longer than the immediately following periods precede the initial period T1. For example, the time sequence in such an embodiment can be Tp (on 200 ns and off 200 ns), Tq (on 200 ns and off 200 ns), and T1 (on 400 ns), followed by the remainder of the embodiment of FIG. 3 with T (off 40 ns (ten percent) and on 360 ns (ninety percent)), etc.

Figure 6:
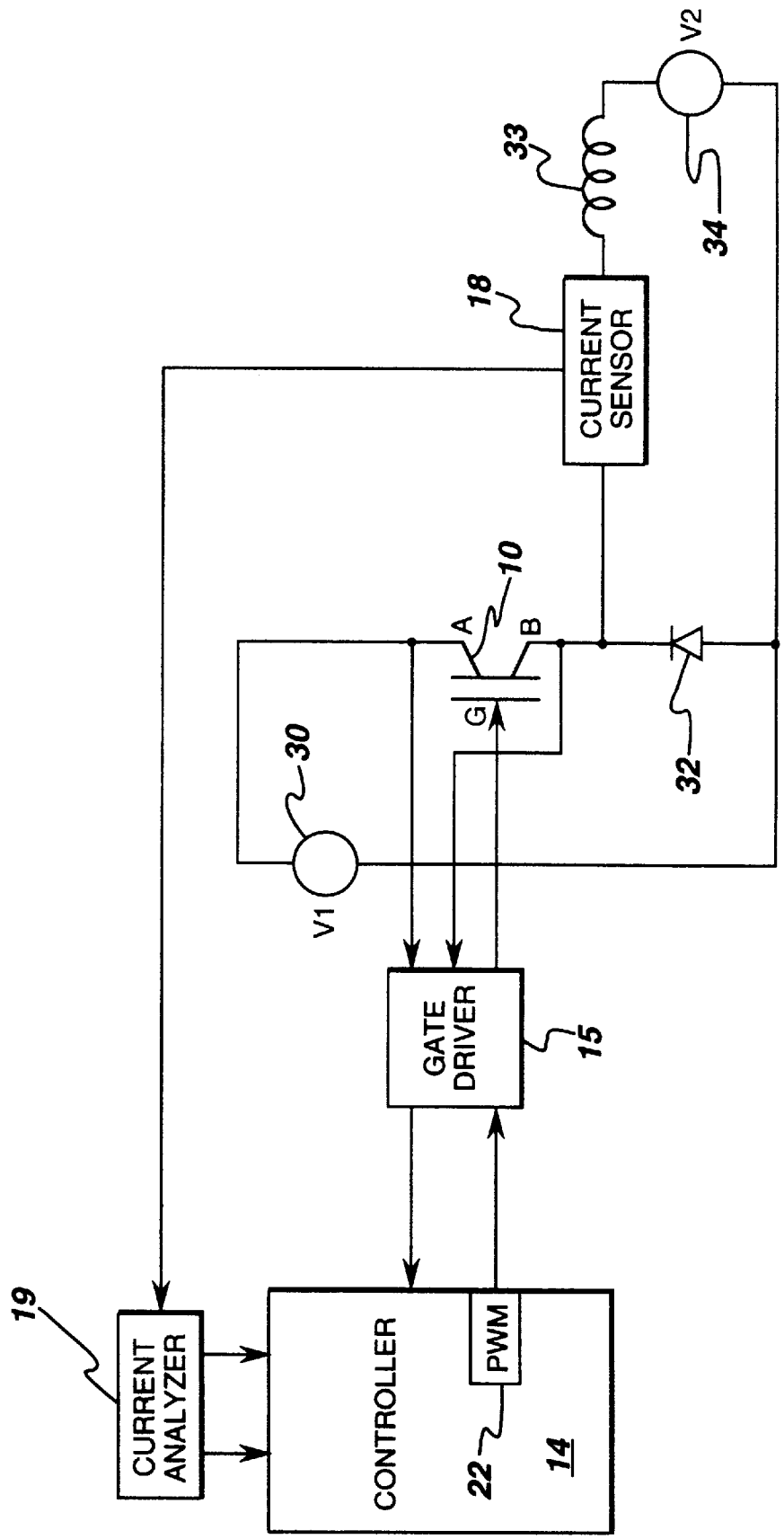
FIG. 6 is a circuit diagram of an application of the present invention in a buck converter.

In addition to gate voltage compensation during $V_{AB}$ saturation conditions by the techniques shown in FIGS. 2–4, the same techniques can be used when an overcurrent has been detected or when the rate of change of current is too high. A current sensor 18 can be used to detect current at either the A terminal (as shown in FIG. 1) or B terminal (as shown in FIG. 6) of power device 10. Current sensor 18 may comprise a current transformer or shunt, for example. A current analyzer 19 may comprise an amplifier 20 for amplifying the current signal before providing the current signal to the controller and an integrator 20 for providing the controller an integrated current signal representative of current changes with respect to time.

Figure 5:
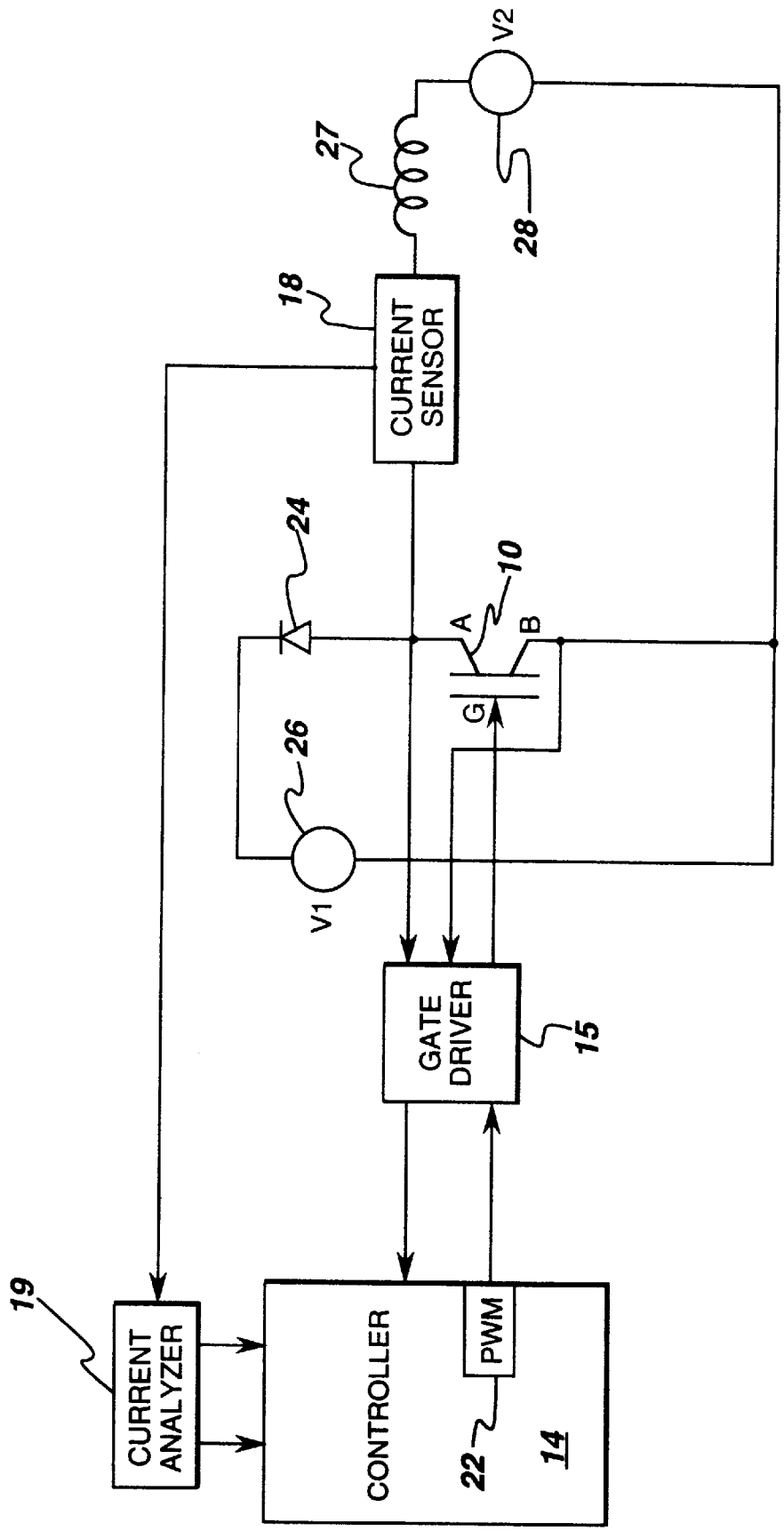
FIG. 5 is a circuit diagram of an application of the present invention in a boost converter.

FIG. 5 is a circuit diagram similar to that of FIG. 1 of an application of the present invention in a boost (DC to DC) converter. A diode 24 is coupled between the A terminal of power device 10 and a voltage source 26 (V1). A voltage output 28 (V2) is coupled directly to the B terminal of power device 10 and through an inductor 27 to the current sensor.

FIG. 6 is a circuit diagram of an application of the present invention in a buck (DC to DC) converter. In this embodiment, current sensor 18 is coupled to the B terminal of power device 10 as well as to a voltage output 34 through an inductor 33. One side of a diode 32 is also coupled to the B terminal, and a voltage source 30 is coupled between the A terminal of power device 10 and the other side of diode 32.

Figure 7:
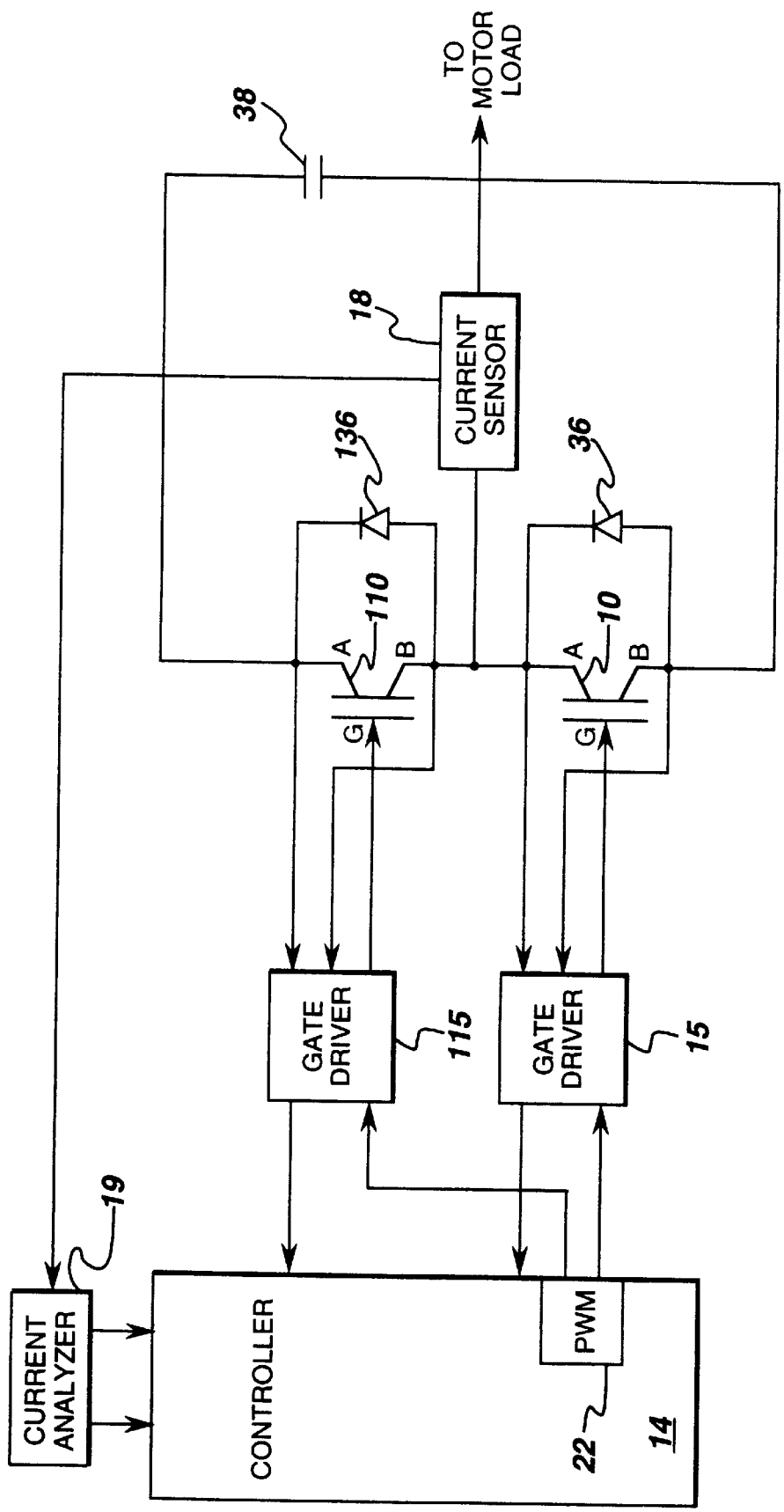
FIG. 7 is a circuit diagram of an application of the present invention in a phase leg for a two level inverter.

FIG. 7 is a circuit diagram of an application of the present invention in a phase leg for a two level inverter for an AC machine. A diode 36 couples the A and B terminals of power device 10 which itself is coupled to a second power device 110 with its corresponding gate driver 115 and diode 136. Both gate drivers 15 and 115 can receive signals from PWM 22, and therefore a single controller can be used to service each power device. A DC link capacitor 38 is coupled between the A terminal of power device 110 and the B terminal of power device 10. When current sensor 18 comprises a current shunt coupled on one side to the B terminal of power device 110 and the A terminal of power device 10, the current shunt can be a current source for one phase leg of a motor.

The circuit diagrams of FIGS. 5–7 are for purposes of example only. The present invention can be used any power device application. When a plurality of power devices are present, each of the gate drivers can be coupled to a common controller. For example, motors having a plurality of phase legs can have a pair of power devices as shown in the embodiment of FIG. 7 corresponding to each phase leg with all of the pairs coupled to a common controller, and the embodiment shown for a two level inverter can be expanded to higher level inverters with each of the gate drivers coupled to a common pulse width modulator.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of controlling gate voltage supplied by a gate driver to a power device of a motor inverter, the method including the steps of:

identifying a presence of a fault condition in the power device;

pulse width modulating a command signal at a carrier frequency higher than a switching frequency of the motor inverter in response to the fault condition; and supplying the modulated command signal to the gate driver to gradually switch off the power device.

2. The method of claim 1, wherein the step of identifying the presence of a fault condition comprises:

determining whether the power device is in an "on" state; and if so comparing a voltage difference between output terminals of the power device with a predetermined maximum voltage difference.

3. The method of claim 1, wherein the step of pulse width modulating a command signal includes varying on/off switching of the command signal to increase a percentage of off time during subsequent periods of modulation.

* * * * *